(12) United States Patent
Staudinger (10) Patent No.: US 8,674,746 B1
(45) Date of Patent: Mar. 18, 2014

(54) ELECTRONIC CIRCUITS WITH VARIABLE ATTENUATORS AND METHODS OF THEIR OPERATION

(71) Applicant: Joseph Staudinger, Gilbert, AZ (US)

(72) Inventor: Joseph Staudinger, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/653,155

(22) Filed: Oct. 16, 2012

(51) Int. Cl.
*H03L 5/00* (2006.01)
(52) U.S. Cl.
USPC ................................. 327/333; 333/81 R
(58) Field of Classification Search
USPC ................. 327/306, 308; 333/81 R
See application file for complete search history.

(56) References Cited

U.S. PATENT DOCUMENTS

| | | | |
|---|---|---|---|
| 4,975,604 A | 12/1990 | Barta | |
| 5,148,062 A * | 9/1992 | Goldfarb | 327/237 |
| 7,205,817 B1 * | 4/2007 | Huang et al. | 327/308 |
| 7,525,395 B2 | 4/2009 | Hwang et al. | |
| 7,786,822 B2 | 8/2010 | Vice | |

* cited by examiner

*Primary Examiner* — Dinh T. Le
(74) *Attorney, Agent, or Firm* — Sherry W. Schumm (57) ABSTRACT

Variable attenuators and methods of their operation are provided. A variable attenuator includes first and second variable resistance circuits and multiple additional resistors. The first variable resistance circuit has a plurality of current paths coupled in parallel between input and output terminals. A first current path includes two first resistors coupled in series between the input and output terminals, and a switch, which has a channel coupled across one of the two first resistors. The multiple additional resistors include second and third resistors. The second resistor is coupled between the input terminal and an intermediate node. The third resistor is coupled between the output terminal and the intermediate node. The second variable resistance circuit is coupled between the intermediate node and a voltage reference terminal. The level of attenuation provided by the attenuator is controlled by a switch control circuit based on a digital input.

19 Claims, 4 Drawing Sheets

ELECTRONIC CIRCUITS WITH VARIABLE ATTENUATORS AND METHODS OF THEIR OPERATION

TECHNICAL FIELD

Embodiments relate generally to variable attenuators (e.g., digitally-controlled step attenuators), electronic circuits in which they are incorporated, and methods of their operation.

BACKGROUND

Electronically adjustable attenuators exhibiting discrete attenuation states have been implemented, for example, in "pi", "T", and "bridge-T" topologies. In each of these topologies, resistive elements are varied to produce a desired amount of attenuation, and each of these topologies may exhibit good return loss (at the input and output terminals) and desired attenuation between input and output when resistor values are properly selected. Typically, each of the "pi" and "T" topologies include three variable resistive elements, which are adjusted to produce a desired amount of attenuation. In contrast, the "bridge-T" topology includes only two resistive elements that need be varied to produce a desired amount of attenuation.

Figure 1:
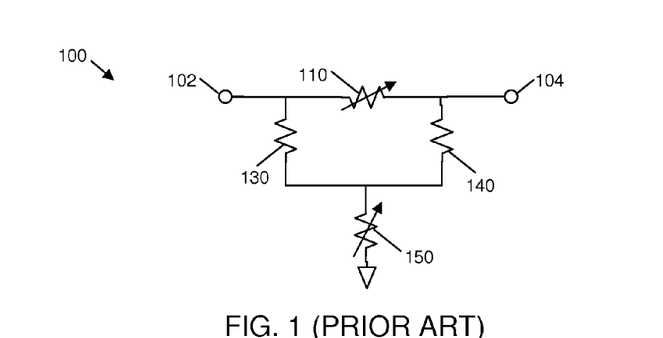
FIG. 1 is a simplified schematic diagram of a conventional bridge-T type attenuator.

FIG. 1 illustrates a simplified schematic diagram of a conventional bridge-T type attenuator 100, which includes two variable resistive elements 110, 150 and two fixed resistive elements 130, 140. In attenuator 100, a first variable resistive element 110 is coupled between input and output terminals 102, 104. The two fixed resistive elements 130, 140 are coupled between the input and output terminals 102, 104, respectively, and an intermediate node. Finally, a second variable resistive element 150 is coupled between the intermediate node and a voltage reference terminal (e.g., ground). By varying resistive elements 110, 150, attenuation of a signal presented at the input terminal 102 may be adjusted to produce a signal at the output terminal 104 with a desired amount of attenuation.

Of particular interest with regard to implementing an attenuator topology at radio frequency (RF) frequencies is the choice and method of implementing the variable resistive elements. For example, using one technique, the variable resistive elements are implemented using PIN diodes (i.e., diodes including an intrinsic semiconductor region sandwiched between a P-type semiconductor region and an N-type semiconductor region), which have resistances that are inversely proportional to their bias currents. Although a topology using PIN diodes may have acceptable return loss and attenuation, a disadvantage to this approach is that significant DC current is consumed by each PIN diode. Accordingly, attenuator topologies for RF applications are desired, which exhibit good return loss and attenuation, while avoiding consumption of significant DC current.

DETAILED DESCRIPTION

Embodiments described herein include variable attenuators (e.g., digitally-controlled step attenuators), electronic circuits in which they are incorporated, and methods of their operation. The various embodiments include attenuators having modified bridge-T configurations, in which variable resistances are implemented using circuits that may have reduced DC current consumption, reduced size, and lower cost, when compared with other implementations.

As used herein, the term "resistor" is meant to include a single resistive element (e.g., a single discrete resistor or other resistive electrical component) or a combination of multiple resistive elements. Accordingly, in the description, figures, and claims, when a "resistor" is mentioned and/or a single resistor is depicted, the "resistor" should be interpreted to include either a single discrete resistor or a multiple-resistor network that has a substantially fixed resistance (e.g., a combination of discrete resistors and/or other resistive elements arranged in series and/or parallel). The term "effective resistance" means a magnitude of electrical resistance or impedance (e.g., in Ohms) of a resistor or resistance circuit under a given set of operating conditions.

Figure 2:
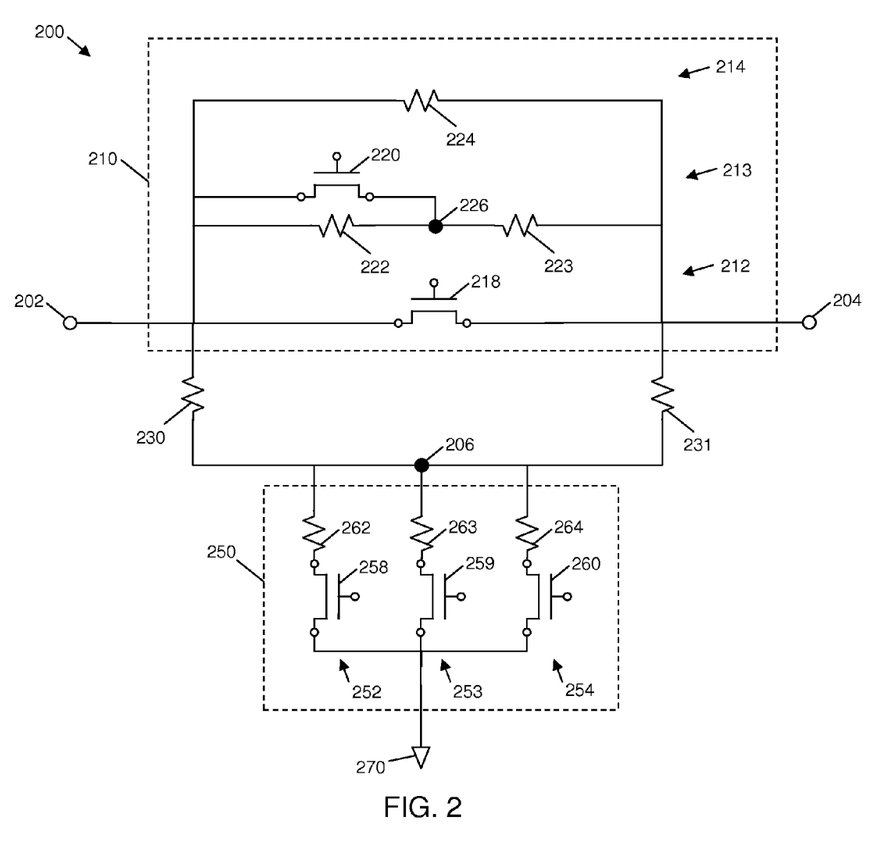
FIG. 2 is a simplified schematic diagram of a variable attenuator, in accordance with an example embodiment.

FIG. 2 is a simplified schematic diagram of a variable attenuator 200, in accordance with an example embodiment. Attenuator 200 includes input terminal 202, output terminal 204, first and second variable resistance circuits 210, 250, and first and second fixed resistors 230, 231. First variable resistance circuit 210 is coupled between input terminal 202 and output terminal 204. First fixed resistor 230 has a first terminal coupled to input terminal 202, and a second terminal coupled to an intermediate node 206. Second fixed resistor 231 has a first terminal coupled to output terminal 204, and a second terminal coupled to the intermediate node 206. Finally, the second variable resistance circuit 250 is coupled between the intermediate node 206 and a voltage reference terminal 270 (e.g., ground).

First and second fixed resistors 230, 231 have values chosen to match the desired, input and output characteristic impedances, $Z_0$, of attenuator 200. For example, first and second fixed resistors 230, 231 may have 50 Ohm impedance values, although first and second fixed resistors 230, 231 may have other values, as well.

The first variable resistance circuit 210 includes multiple current paths 212, 213, 214 coupled in parallel with each other between the input and output terminals 202, 204. More specifically, the first variable resistance circuit 210 includes a first current path 212, a second current path 213, and a third current path 214. The first current path 212 includes a switch 218 (also referred to below as $S_{218}$) having a control terminal coupled to a switch control circuit (e.g., switch control circuit 300, FIG. 3, discussed later), a variably conductive channel, a first current conducting terminal coupled to the input terminal 202, and a second current conducting terminal coupled to the output terminal 204. For example, switch 218 may be a field effect transistor (FET) with a variably conductive channel between source and drain terminals (current conducting terminals), where the conductivity of the channel is modulated based on a control signal provided to a gate terminal (control terminal) of the FET.

The second current path 213 of variable resistance circuit 210 includes two resistors 222, 223 and switch 220 (also referred to below as $S_{220}$). The two resistors 222, 223 are coupled in series with each other between the input and output terminals 202, 204. More specifically, resistor 222 has a first terminal coupled to the input terminal 202, and a second terminal coupled to an intermediate node 226. Resistor 223 has a first terminal coupled to the intermediate node 226, and a second terminal coupled to the output terminal 204. Switch 220 has a control terminal coupled to a switch control circuit (e.g., switch control circuit 300, FIG. 3, discussed later), a variably conductive channel, and first and second current conducting terminals. The variably conductive channel of switch 220 is coupled across one of resistors 222, 223. For example, in the embodiment of FIG. 2, the variably conductive channel of switch 220 is coupled across resistor 222. More specifically, a first current conducting channel of switch 220 is coupled to the input terminal 202, and a second current conducting terminal of switch 220 is coupled to the intermediate node 226. In an alternate embodiment, the variably conductive channel of switch 220 may be coupled instead across resistor 223.

The third current path 214 of variable resistance circuit 210 includes resistor 224 coupled between the input and output terminals 202, 204. More specifically, resistor 224 has a first terminal coupled to the input terminal 202, and a second terminal coupled to the output terminal 204.

As mentioned above, the second variable resistance circuit 250 is coupled between intermediate node 206 and voltage reference terminal 270. More specifically, the second variable resistance circuit 250 includes multiple current paths 252, 253, 254 coupled in parallel with each other between the intermediate node 206 and the voltage reference terminal 270. Although the embodiment of second variable resistance circuit 250 shown in FIG. 2 includes three current paths 252-254, other embodiments may include more or fewer than three current paths. Either way, according to an embodiment, each current path 252-254 includes a resistor 262, 263, 264 coupled in series with a switch 258, 259, 260 (also referred to below as $S_{258}$, $S_{259}$, and $S_{260}$), where each of switches 258-260 includes a control terminal, a variably conductive channel, and first and second current conducting terminals. The control terminal of each of switches 258-260 is coupled to a switch control circuit (e.g., switch control circuit 300, FIG. 3, discussed later). For example, in the embodiment illustrated in FIG. 2, first terminals of each of resistors 262-264 are coupled to the intermediate node 206, and second terminals of each of resistors 262-264 are coupled to first current conducting terminals of switches 258-260. Second current conducting terminals of switches 258-260 are coupled to the voltage reference terminal 270. In alternate embodiments, the resistors 262-264 and switches 258-260 may be reversed. More particularly, for example, first current conducting terminals of each of switches 258-260 may be coupled to the intermediate node 206, second current conducting terminals of switches 258-260 may be coupled to first terminals of resistors 262-264, and second terminals of resistors 262-264 may be coupled to the voltage reference terminal 270, in an alternate embodiment.

According to an embodiment, each of switches 218, 220, 258-260 are controlled in a manner in which they are either substantially non-conductive (e.g., "off" or "open") or substantially conductive (e.g., "on" or "closed"). For example, in embodiments in which switches 218, 220, 258-260 are FETs, switches 218, 220, 258-260 may be operated in their linear regions in a zero-bias mode (e.g., during operation, no substantial bias current flows through switches 218, 220, 258-260, and their gate-source voltage, $V_{GS}$, is less than the gate-source voltage $V_{GSTH}$, for an N-Channel FET). Accordingly, each of switches 218, 220, 258-260 has a negligible resistance when it is switched on (e.g., when $V_{GS}$ is greater than the gate-source voltage threshold, $V_{GSTH}$, for an N-channel FET, for example, zero volts), and a substantially infinite resistance when it is switched off (e.g., when $V_{GS}$ is less than $V_{GSTH}$ for an N-channel FET).

According to an embodiment, during operation, the effective resistance of the first variable resistance circuit 210, referred to as $R_{210}$, and the effective resistance of the second variable resistance circuit 250, referred to as $R_{250}$, are varied as follows:

$$R_{210}R_{250}=Z_0^2, \quad \text{(Equation 1)}$$

where $Z_0$ is the desired characteristic impedance. The attenuation, when matched, is given by:

$$\text{attenuation (dB)} = 20 \log ((R_{210}/R_{250})^{1/2} + 1) \quad \text{(Equation 2)}$$
$$20 \log ((R_{210}/Z_0) + 1.$$

The effective resistance of the first variable resistance circuit 210 depends on the values of resistors 222-224 and the states of switches 218, 220, and the effective resistance of the second variable resistance circuit 250 depends on the values of resistors 262-264 and the states of switches 258-260. Essentially, different combinations of the states of switches 218, 220 yield different parallel combinations of resistors (i.e., resistors 222-224) in the first variable resistance circuit 210 (and thus different effective resistances of first variable resistance circuit 210), and different combinations of the states of switches 258-260 yield different parallel combinations of resistors (i.e., resistors 262-264) in the second variable resistance circuit 250 (and thus different effective resistances of second variable resistance circuit 250). According to an embodiment, switches 218, 220, and 258-260 are controlled to provide for four different combinations of effective resistances $R_{210}$, $R_{250}$, and thus to provide for four different levels of attenuation. In addition, the values of resistors 222-224 and 262-264 are selected to satisfy Equation 1, above, in an embodiment. According to a specific embodiment, for example, the switches 218, 220, 258-260 of attenuator 200 are controlled to provide combinations of effective resistances $R_{210}$, $R_{250}$ that produce attenuation levels of about 0 decibels (dB), about 2 dB, about 4 dB, and about 6 dB. In alternate embodiments, resistors 222-224 and 262-264 may be selected to have values, and/or switches 218, 220, 258-260 may be controlled to produce more, fewer, or different levels of attenuation.

For example, effective resistances $R_{210}$, $R_{250}$ that may result in the above-given example attenuation levels may be:

TABLE 1

Example Attenuation Levels and Effective Resistance Values

| Attenuation (dB) | $R_{210}$ (Ohms) | $R_{250}$ (Ohms) | $Z_0$ (Ohms) |
|---|---|---|---|
| 0.0 | 0 | infinite | 50 |
| 2.0 | 12.9 | 193 | 50 |

TABLE 1-continued

Example Attenuation Levels and Effective Resistance Values

| Attenuation (dB) | $R_{210}$ (Ohms) | $R_{250}$ (Ohms) | $Z_0$ (Ohms) |
|---|---|---|---|
| 4.0 | 29.2 | 85.5 | 50 |
| 6.0 | 49.8 | 50.24 | 50 |

According to an embodiment, the states (e.g., "on" or "off") of switches 218, 220, and 262-264 are controlled to produce the above-given example attenuation levels as follows:

TABLE 2

Example Attenuation Levels and Switch States

| Attenuation (dB) | $S_{218}$ | $S_{220}$ | $S_{258}$ | $S_{259}$ | $S_{260}$ |
|---|---|---|---|---|---|
| 0.0 | ON | ON | OFF | OFF | OFF |
| 2.0 | OFF | ON | ON | OFF | OFF |
| 4.0 | OFF | ON | ON | ON | OFF |
| 6.0 | OFF | OFF | ON | ON | ON |

It is to be understood that the example effective resistances $R_{210}$, $R_{250}$ and switch states provided above are not meant to be limiting, and that other attenuator embodiments may be configured to have different effective resistances and/or switches that are controlled in a different manner to produce more, fewer, or different attenuation levels.

To indicate an example of the relative magnitudes of the values of resistors 222-224 and 262-264, example values for resistors 222-224 and 262-264 are listed below. It is to be understood that the resistor values and/or their relative magnitudes may be different from these example values. For example, resistor 222 may have a value of about 57 Ohms, resistor 223 may have a value of about 15 Ohms, resistor 224 may have a value of about 78 Ohms, resistor 262 may have a value of about 174 Ohms, resistor 263 may have a value of about 184 Ohms, and resistor 264 may have a value of about 37.5 Ohms.

As mentioned previously, the states of switches 218, 220, and 258-260 are controlled based on switch control signals provided to the control terminals (e.g., gate terminals) of switches 218, 220, and 258-260. According to an embodiment, the switch control signals are produced by a switch control circuit (e.g., switch control circuit 300, FIG. 3) based on a digital input. In other words, attenuator 200 is digitally controlled, in an embodiment, meaning that a digital input defines the level of attenuation to be applied by attenuator 200 to an input signal at any given time. For example, with four different attenuation levels, as described above, a two-bit digital input may be used to select which of the four different attenuation levels attenuator 200 will apply.

Figure 3:
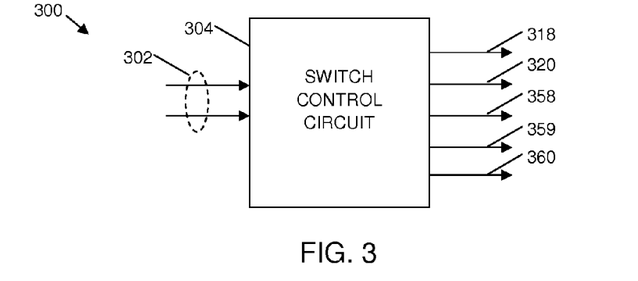
FIG. 3 is a simplified block diagram of a switch control circuit for the attenuator of FIG. 2, in accordance with an example embodiment.

FIG. 3 is a simplified block diagram of a switch control circuit 300 for the attenuator of FIG. 2, in accordance with an example embodiment. Switch control circuit 300 includes a digital input 302, switch control logic 304, and a plurality of switch control signal outputs 318, 320, 358, 359, 360, according to an embodiment. Digital input 302 is a multiple-bit input, in an embodiment, which is configured to receive a plurality of digital input signals in parallel (e.g., two signals in parallel, as illustrated). More specifically, each input signal corresponds to a bit of a multiple bit wide, digital control signal. For example, in an embodiment in which an attenuator (e.g., attenuator 200, FIG. 2) controlled by switch control circuit 300 is configured to apply four different attenuation levels (e.g., 0 dB, 2 dB, 4 dB, and 6 dB of attenuation), the digital control signal may be a two bit wide signal, as illustrated in FIG. 3. In such an embodiment, each digital value represented by the input signal combination may correspond to one of the four different attenuation levels. In an alternate embodiment, the digital input 302 may be implemented as a serial interface.

In response to receiving a digital input value, switch control logic 304 produces a combination of switch control signals on switch control signal outputs 318, 320, and 358-360. Although details of switch control logic 304 are not illustrated or described herein, those of skill in the art would understand how to implement logic that would convert the digital input values to appropriate switch control signals, based on the description herein. A number of different logic topologies may be suitable to perform the desired conversion. In any event, according to an embodiment, each of the switch control signals is provided to a control terminal of a different one of the attenuator's switches, in order to affect the switches' conductivities (i.e., to turn each switch on or off). For example, referring also to FIG. 2, switch control signals provided on switch control signal outputs 318, 320, 358, 359, and 360 may be provided to switches 218, 220, 258, 259, and 260, respectively. By turning the various switches 218, 220, and 258-260 on or off, as described previously, the effective resistances of the first and second variable resistance circuits 210, 250 are adjusted, as is the attenuation level applied by attenuator 200.

In the embodiment discussed in conjunction with FIG. 2, attenuator 200 includes a single stage of attenuation. More specifically, the single-stage attenuator 200 of FIG. 2 includes a first variable resistance circuit 210 with three current paths 212-214, first and second fixed resistors 230, 231, and a second variable resistance circuit 250 with three additional current paths 252-254. In various alternate embodiments, the first and/or second variable resistance circuits may include more or fewer current paths, and/or the attenuator may include more than one attenuation stage.

Figure 4:
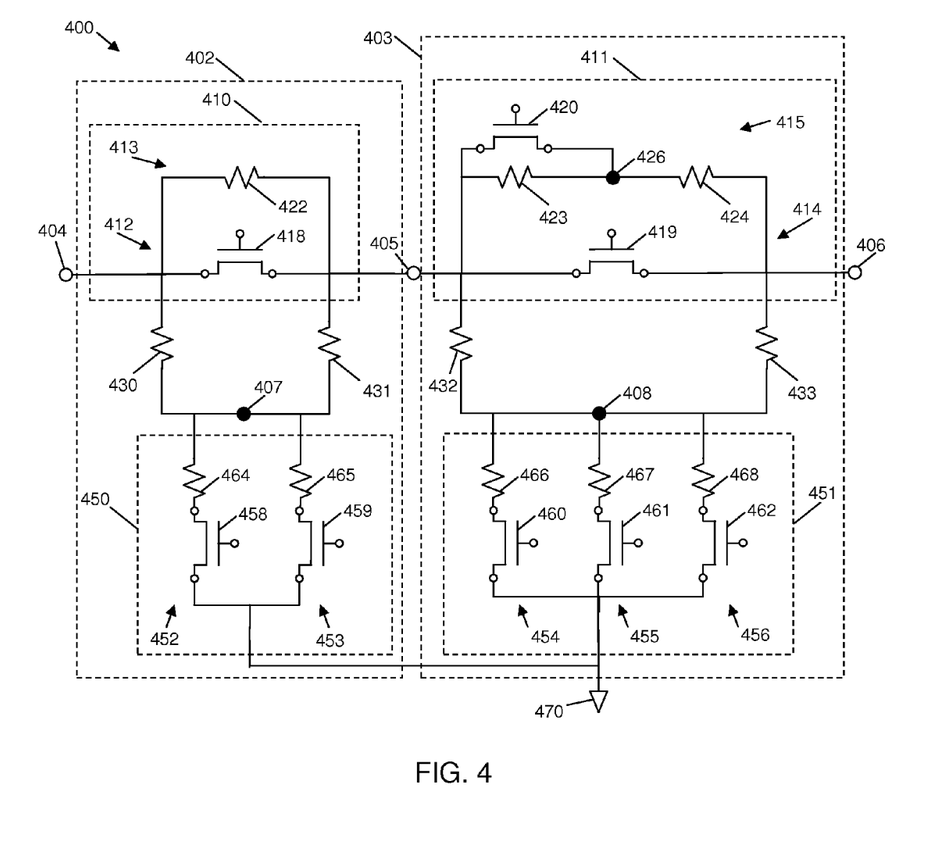
FIG. 4 is a simplified schematic diagram of a variable attenuator, in accordance with another example embodiment.

For example, FIG. 4 is a simplified schematic diagram of a multiple-stage, variable attenuator 400, in accordance with another example embodiment. Attenuator 400 includes a first attenuation stage 402 that provides a first number of attenuation levels, and a second attenuation stage 403 that provides a second number of attenuation levels. The first and second number of attenuation levels may be the same or different from each other, and the total number of attenuation levels provided by attenuator 400 is a number up to the product of the first and second numbers of attenuation levels. For example, in an embodiment in which the first attenuation stage 402 provides four attenuation levels, and the second attenuation stage 403 provides four additional attenuation levels, the total number of attenuation levels provided by attenuator 400 may be up to sixteen attenuation levels.

The first and second attenuation stages 402, 403 are coupled in series between an input terminal 404 and an output terminal 406. More specifically, an output of the first attenuation stage 402 is coupled to an input of the second attenuation stage 403 (both designated as terminal 405 in FIG. 4). Accordingly, an input signal provided to input terminal 404 may be first attenuated by first attenuation stage 402, and the resulting attenuated signal (at terminal 405) may be further attenuated by second attenuation stage 403. The total attenuation of the signal is the sum of the first attenuation and the second attenuation, and the twice attenuated signal (assuming neither stage 402, 403 applied 0.0 dB of attenuation) is provided at output terminal 406.

Although both the first and second attenuation stages 402, 403 differ from the attenuation stage illustrated in FIG. 2, the first and second attenuation stages 402, 403 do have some similarities. With regard to the similarities, the first and second attenuation stages 402, 403 each include first variable resistance circuits 410, 411, second variable resistance circuits 450, 451, and first and second fixed resistors 430, 431, 432, 433. In each stage 402, 403, the first variable resistance circuit 410, 411 is coupled between an input terminal (terminal 404 for the first stage 402 and terminal 405 for the second stage 403) and an output terminal (terminal 405 for the first stage 402 and terminal 406 for the second stage 403). Each of the first fixed resistors 430, 432 has a first terminal coupled to the respective input terminals 404, 405, and a second terminal coupled to an intermediate node 407, 408. Each of the second fixed resistors 431, 433 has a first terminal coupled to the respective output terminals 405, 406, and a second terminal coupled to the respective intermediate node 407, 408. As with the embodiment of FIG. 2, the first and second fixed resistors 430-433 has a value chosen to match the desired, input and output characteristic impedances, $Z_0$, of attenuator 400. Finally, each second variable resistance circuit 450, 451 is coupled between its respective intermediate node 407, 408 and a voltage reference terminal 470 (e.g., ground).

In the first attenuation stage 402, the first variable resistance circuit 410 includes two current paths 412, 413 coupled in parallel with each other between the input and output terminals 404, 405. A first current path 412 includes a switch 418 (e.g., a FET or BJT, also referred to below as $S_{418}$) having a control terminal coupled to a switch control circuit (e.g., switch control circuit 500, FIG. 5, discussed later), a variably conductive channel, a first current conducting terminal coupled to the input terminal 404, and a second current conducting terminal coupled to the output terminal 405. A second current path 413 of variable resistance circuit 410 includes resistor 422 coupled between the input and output terminals 404, 405. More specifically, resistor 422 has a first terminal coupled to the input terminal 404, and a second terminal coupled to the output terminal 405.

The second variable resistance circuit 450 includes two current paths 452, 453 coupled in parallel with each other between the intermediate node 407 and the voltage reference terminal 470. Although the embodiment of second variable resistance circuit 450 shown in FIG. 4 includes two current paths 452, 453, other embodiments may include more or fewer than two current paths. Either way, according to an embodiment, each current path 452, 453 includes a resistor 464, 465 coupled in series with a switch 458, 459 (also referred to below as $S_{458}$, $S_{459}$), where each of switches 458, 459 includes a control terminal, a variably conductive channel, and first and second current conducting terminals. The control terminal of each of switches 458, 459 is coupled to a switch control circuit (e.g., switch control circuit 500, FIG. 5, discussed later). For example, in the embodiment illustrated in FIG. 4, first terminals of each of resistors 464, 465 are coupled to the intermediate node 407, and second terminals of each of resistors 464, 465 are coupled to first current conducting terminals of switches 458, 459. Second current conducting terminals of switches 458, 459 are coupled to the voltage reference terminal 470. In alternate embodiments, the resistors 464, 465 and switches 458, 459 may be reversed.

To indicate an example of the relative magnitudes of the values of resistors 422, 464, and 465, example values for resistors 422, 464, and 465 are listed below. It is to be understood that the resistor values and/or their relative magnitudes may be different from these example values. For example, resistor 422 may have a value of about 8 Ohms, resistor 464 may have a value of about 424 Ohms, and resistor 465 may have a value of about 301 Ohms.

The configuration of the second attenuation stage 403 is similar to the configuration of the attenuator 200 (FIG. 2), with the exception of the first variable resistance circuit 411 (and the various resistor values). More particularly, the first variable resistance circuit 411 essentially is a simplified implementation of the first variable resistance circuit 210 (FIG. 2), in that there is not a third current path comprising a single resistor (e.g., resistor 224) coupled between the input and output terminals 405, 406 (i.e., resistor 224 has been eliminated). Instead, the resistance that such a resistor otherwise would have contributed is essentially "folded" into the first variable resistance circuit 411 by an adjustment of the values of resistors 423, 424. Accordingly, in the second attenuation stage 403, the first variable resistance circuit 411 includes two current paths 414, 415 coupled in parallel with each other between the input and output terminals 405, 406. A first current path 414 includes a switch 419 (e.g., a FET or BJT, also referred to below as $S_{419}$) having a control terminal coupled to a switch control circuit (e.g., switch control circuit 500, FIG. 5, discussed later), a variably conductive channel, a first current conducting terminal coupled to the input terminal 405, and a second current conducting terminal coupled to the output terminal 406.

The second current path 415 of variable resistance circuit 411 includes two resistors 423, 424 and switch 420 (also referred to below as $S_{420}$). The two resistors 423, 424 are coupled in series with each other between the input and output terminals 405, 406. More specifically, resistor 423 has a first terminal coupled to the input terminal 405, and a second terminal coupled to an intermediate node 426. Resistor 424 has a first terminal coupled to the intermediate node 426, and a second terminal coupled to the output terminal 406. Switch 420 has a control terminal coupled to a switch control circuit (e.g., switch control circuit 500, FIG. 5, discussed later), a variably conductive channel, and first and second current conducting terminals. The variably conductive channel of switch 420 is coupled across one of resistors 423, 424. For example, in the embodiment of FIG. 4, the variably conductive channel of switch 420 is coupled across resistor 423. More specifically, a first current conducting channel of switch 420 is coupled to the input terminal 405, and a second current conducting terminal of switch 420 is coupled to the intermediate node 426. In an alternate embodiment, the variably conductive channel of switch 420 may be coupled instead across resistor 424.

The second variable resistance circuit 451 includes multiple current paths 454, 455, 456 coupled in parallel with each other between intermediate node 408 and the voltage reference terminal 470. Although the embodiment of second variable resistance circuit 451 shown in FIG. 4 includes three current paths 454-456, other embodiments may include more or fewer than three current paths. Either way, according to an embodiment, each current path 454-456 includes a resistor 466, 467, 468 coupled in series with a switch 460, 461, 462 (also referred to below as $S_{460}$, $S_{461}$, and $S_{462}$), where each of switches 460-462 includes a control terminal, a variably conductive channel, and first and second current conducting terminals. The control terminal of each of switches 460-462 is coupled to a switch control circuit (e.g., switch control circuit 500, FIG. 5, discussed later). For example, in the embodiment illustrated in FIG. 4, first terminals of each of resistors 466-468 are coupled to intermediate node 408, and second terminals of each of resistors 466-468 are coupled to first current conducting terminals of switches 460-462. Second current conducting terminals of switches 466-468 are coupled to the voltage reference terminal 470. In alternate embodiments, the resistors 466-468 and switches 460-462 may be reversed.

To indicate an example of the relative magnitudes of the values of resistors 423, 424 and 466-468, example values for resistors 423, 424 and 466-468 are listed below. It is to be understood that the resistor values and/or their relative magnitudes may be different from these example values. For example, resistor 423 may have a value of about 25 Ohms, resistor 424 may have a value of about 12.5 Ohms, resistor 466 may have a value of about 174 Ohms, resistor 467 may have a value of about 184 Ohms, and resistor 468 may have a value of about 36.5 Ohms.

The effective resistances of the first variable resistance circuits 410, 411 (referred to as $R_{410}$, $R_{411}$, respectively) depend on the values of resistors 422-424 and the states of switches 418-420, and the effective resistances of the second variable resistance circuits 450, 451 (referred to as $R_{450}$, $R_{451}$, respectively) depend on the values of resistors 464-468 and the states of switches 458-462. According to an embodiment, the switches 418-420 and 458-462 of each attenuation stage 402, 403 are controlled to provide four different combinations of effective resistances $R_{410}$, $R_{411}$, $R_{450}$, $R_{451}$, and thus to provide for four different levels of attenuation, each. Accordingly, attenuator 400 may provide up to sixteen total attenuation levels. The total number of attenuation levels may be less than sixteen, for example, if one of the attenuation levels for each attenuation stage 402, 403 is 0 dB and/or if some of the attenuation levels for the attenuation stages 402, 403 are the same. According to an embodiment, both attenuation stages 402, 403 may provide 0 dB of attenuation (and thus the entire attenuator 400 may provide 0 dB of attenuation), but the remaining levels of attenuation for the stages are different from each other. According to a specific embodiment, for example, the switches 418, 458, 459 of attenuator stage 402 are controllable to provide combinations of effective resistances $R_{410}$, $R_{450}$, that produce total attenuation levels (between input terminal 404 and output terminal 405) of about 0 dB, about 0.5 dB, about 1 dB, and about 1.5 dB, and the switches 419, 420, and 466-468 of attenuator stage 403 are controllable to provide combinations of effective resistances $R_{411}$, $R_{451}$, that produce total attenuation levels (between input terminal 405 and output terminal 406) of about 0 dB, about 2 dB, about 4 dB, and about 6 dB.

According to an embodiment, the states of switches 418, 458, and 459 are controlled to produce the above-given example attenuation levels for the first attenuation stage 402 as follows:

TABLE 3

Example Attenuation Levels and Switch States for Stage 402

| Attenuation (dB) | $S_{418}$ | $S_{458}$ | $S_{459}$ |
|---|---|---|---|
| 0.0 | ON | OFF | OFF |
| 0.5 | OFF | OFF | OFF |
| 1.0 | OFF | ON | OFF |
| 1.5 | OFF | ON | ON |

In addition, according to an embodiment, the states of switches 419, 420, and 460-462 are controlled to produce the above-given example attenuation levels for the second attenuation stage 203 as follows:

TABLE 4

Example Attenuation Levels and Switch States for Stage 403

| Attenuation (dB) | $S_{419}$ | $S_{420}$ | $S_{460}$ | $S_{461}$ | $S_{462}$ |
|---|---|---|---|---|---|
| 0.0 | ON | ON | OFF | OFF | OFF |
| 2.0 | OFF | ON | ON | OFF | OFF |
| 4.0 | OFF | ON | ON | ON | OFF |
| 6.0 | OFF | OFF | ON | ON | ON |

According to the above example, attenuator 400 is capable of applying a total of sixteen attenuation levels to signals that are input to attenuator 400, and those attenuation levels are (in dB): 0.0, 0.5, 1.0, 1.5, 2.0, 2.5, 3.0, 3.5, 4.0, 4.5, 5.0, 5.5, 6.0, 6.5, 7.0, and 7.5. It is to be understood that the example switch states provided above in Tables 3 and 4 are not meant to be limiting, and that other attenuator embodiments may be controlled in a different manner to produce more, fewer, or different attenuation levels.

As mentioned previously, the states of switches 418-420 and 458-462 are controlled based on switch control signals provided to the control terminals (e.g., gate terminals) of switches 418-420 and 458-462. According to an embodiment, the switch control signals are produced by a switch control circuit (e.g., switch control circuit 500, FIG. 5) based on a digital input. In other words, attenuator 400 is digitally controlled, as previously discussed. For example, with sixteen different attenuation levels for variable attenuator 400, as described above, a four-bit digital input may be used to select which of up to sixteen different attenuation levels attenuator 400 will apply.

Figure 5:
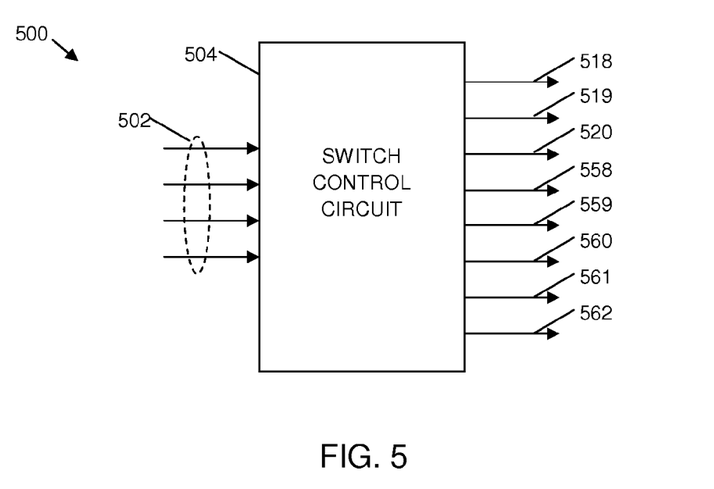
FIG. 5 is a simplified block diagram of a switch control circuit for the attenuator of FIG. 4, in accordance with an example embodiment.

FIG. 5 is a simplified block diagram of a switch control circuit 500 for the attenuator of FIG. 4, in accordance with an example embodiment. Switch control circuit 500 includes a digital input 502, switch control logic 504, and a plurality of switch control signal outputs 518, 519, 520, 558, 559, 560, 561, 562, according to an embodiment. Digital input 502 is a multiple-bit input, in an embodiment, which is configured to receive a plurality of digital input signals in parallel (e.g., four signals in parallel, as illustrated). More specifically, each input signal corresponds to a bit of a multiple bit wide, digital control signal. For example, in an embodiment in which an attenuator (e.g., attenuator 400, FIG. 4) controlled by switch control circuit 500 is configured to apply up to sixteen different total attenuation levels, the digital control signal may be a four bit wide signal, as illustrated in FIG. 5. In such an embodiment, each digital value represented by the input signal combination may correspond to one of up to sixteen different attenuation levels. In an alternate embodiment, the digital input 502 may be implemented as a serial interface.

In response to receiving a digital input value, switch control logic 504 produces a combination of switch control signals on switch control signal outputs 518-520, and 558-562. Although details of switch control logic 504 are not illustrated or described herein, those of skill in the art would understand how to implement logic that would convert the digital input values to appropriate switch control signals, based on the description herein. A number of different logic topologies may be suitable to perform the desired conversion. In any event, according to an embodiment, each of the switch control signals is provided to a control terminal of a different one of the attenuator's switches, in order to affect the switches' conductivities (i.e., to turn each switch on or off). For example, referring also to FIG. 4, switch control signals provided on switch control signal outputs 518-520 and 558-562 may be provided to switches 418-420 and 458-462, respectively. By turning the various switches 418-420 and 458-462 on or off, as described previously, the effective resistances of the first and second variable resistance circuits 410, 411, 450, 451 are adjusted, as is the total attenuation level applied by attenuator 400.

Although attenuator 400 is shown to include two attenuation stages 402, 403, alternate embodiments may include more than two attenuation stages. In addition, in other alternate embodiments, the first and second attenuation stages 402, 403 may be reversed in sequence (e.g., the output of attenuation stage 403 may be coupled to the input of attenuation stage 402. In still other alternate embodiments, any combination of attenuation stages 200 (FIG. 2), 402, and/or 403 may included in a variable attenuator, and a correspondingly modified switch control circuit may be designed to control the conductivities of the various switches, accordingly.

Embodiments of attenuators discussed herein may be incorporated into any of a variety of electronic circuits and systems. For example, one or more attenuator embodiments may be incorporated into a transmitter and/or receiver lineups of an RF system. As a more specific example, one or more attenuator embodiments may be incorporated into a Doherty amplifier system that may be included in the transmitter lineup of an RF system.

Figure 6:
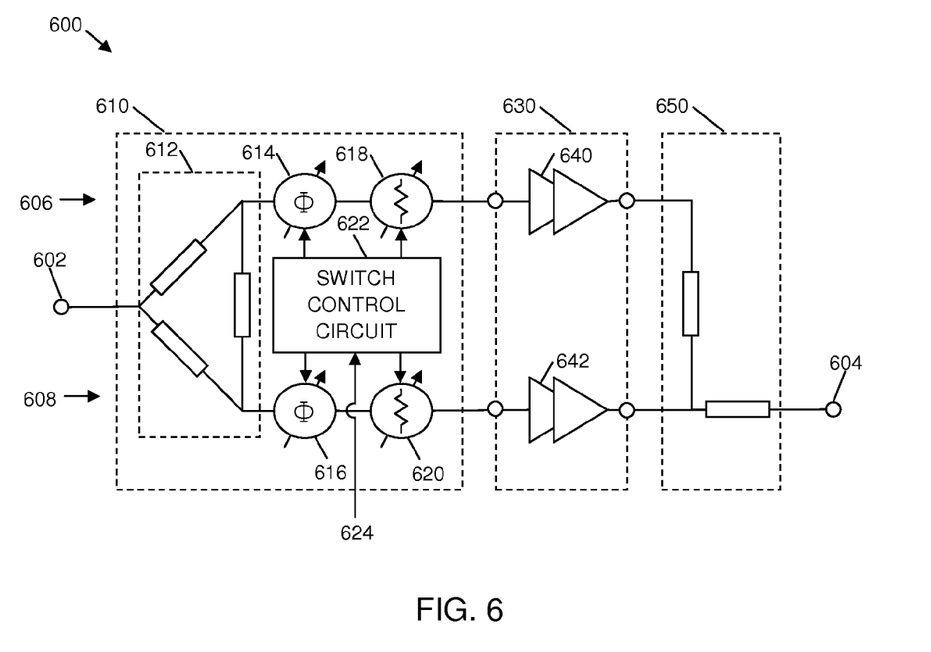
FIG. 6 is a simplified block diagram of an amplifier system, which includes a pair of variable attenuators, in accordance with an example embodiment.

FIG. 6 illustrates an amplifier system 600, which includes a set of variable attenuators 618, 620, in accordance with an example embodiment. Amplifier system 600 includes an input terminal 602, an output terminal 604, an input circuit 610, an amplifier circuit 630, and an output circuit 650, according to an embodiment. The input circuit 610 is coupled between input terminal 602 and input terminals to the amplifier circuit 630, and the output circuit 650 is coupled between output terminals of the amplifier circuit 630 and output terminal 604. An input signal received at input terminal 602 is amplified by amplifier system 600 and provided to a load (e.g., an antenna, not illustrated) via output terminal 604.

Amplifier system 600 is configured in a Doherty amplifier topology, which includes multiple amplifier stages 640, 642 along parallel amplification paths 606, 608, each of which may supply current to a load (e.g., an antenna, not illustrated). More specifically, amplifier system 600 is a two-stage Doherty amplifier, which includes a main amplifier stage 640 (biased in a class-AB mode) along a first amplification path 606, and a peaking amplifier stage 642 (biased in a class-C mode) along a second amplification path 608. At input power levels below the threshold of the peaking amplifier stage 642, only the main amplifier stage 640 provides current to the load. At input power levels exceeding the threshold of the peaking amplifier stage 642, signals output from both the main and peaking amplifier stages 640, 642 are summed in-phase to provide current to the load. In other embodiments, amplifier system 600 may include a main amplifier stage and two peaking amplifier stages, with each peaking amplifier stage being biased at a different class-C operating point. Accordingly, although amplifier system 600 includes only two amplification paths 606, 608, an amplifier system may include three (or more) amplification paths, in alternate embodiments.

Input circuit 610 includes a power splitter 612 configured to split the power of the input signal received at terminal 602 along the two amplification paths 606, 608. The power splitter 612 also may apply a phase shift (typically a value of 90 degrees achieved using quarter wave length transmission line) to the signal carried along one of the amplification paths (e.g., along amplification path 608), for example, so that the signals carried along the two amplification paths 606, 608 are out of phase (e.g., 90 degrees out of phase), with respect to each other. The power splitter 612 may divide the input power equally between the amplification paths 606, 608, such that roughly 50 percent of the input signal power is provided to each amplification path 606, 608.

According to an embodiment, the input circuit 610 also includes a first phase shifter 614 and a first variable attenuator 618 along the first amplification path 606, and a second phase shifter 616 and a second variable attenuator 620 along the second amplification path 608. Although the phase shifters 614, 616 are shown to precede the variable attenuators 618, 620 along amplification paths 606, 608, the phase shifters 614, 616 and attenuators 618, 620 may be reversed in order, in an alternate embodiment. Either way, based on control signals provided by switch control circuit 622, the first and second phase shifters 614, 616 apply phase shifts to the signals conveyed along the first and second amplification paths 606, 608, and the first and second variable attenuators 618, 620 attenuate the signals conveyed along the first and second amplification paths 606, 608. For example, the first and second variable attenuators 618, 620 may be configured according to any of the above-described attenuator embodiments, and the switch control circuit 622 may produce switch control signals that affect the attenuation level applied by the attenuators 618, 620 based on digital inputs as previously described. As discussed previously, the switch control circuit 622 may include a digital input 624 (e.g., digital input 302, 502, FIGS. 3, 5) for receiving a digital control signal. The digital input 624 is coupled to a data interface (e.g., a serial interface such as a serial peripheral interface (SPI), not illustrated). The data interface (e.g., the SPI) may be implemented on the same integrated circuit chip as the input circuit 610 (e.g., a single silicon chip or a single gallium-arsenide chip), or the data interface and the input circuit 610 may be implemented on different integrated circuit chips (e.g., two silicon chips, two gallium-arsenide chips, or a combination of one silicon chip (e.g., for the SPI) and one gallium-arsenide chip (e.g., for the input circuit 610)).

After amplification of the signals carried on the first and second amplification paths 606, 608 by the main amplifier stage 640 and the peaking amplifier stage 642, respectively, the signals are combined by output circuit 650. The output circuit 650 also may apply a phase shift (typically a value of 90 degrees achieved using quarter wave length transmission line) to the signal carried along one of the amplification paths (e.g., along amplification path 606), for example, so that the signals carried along the two amplification paths 606, 608 are summed in phase before being provided to the output terminal 604.

Figure 7:
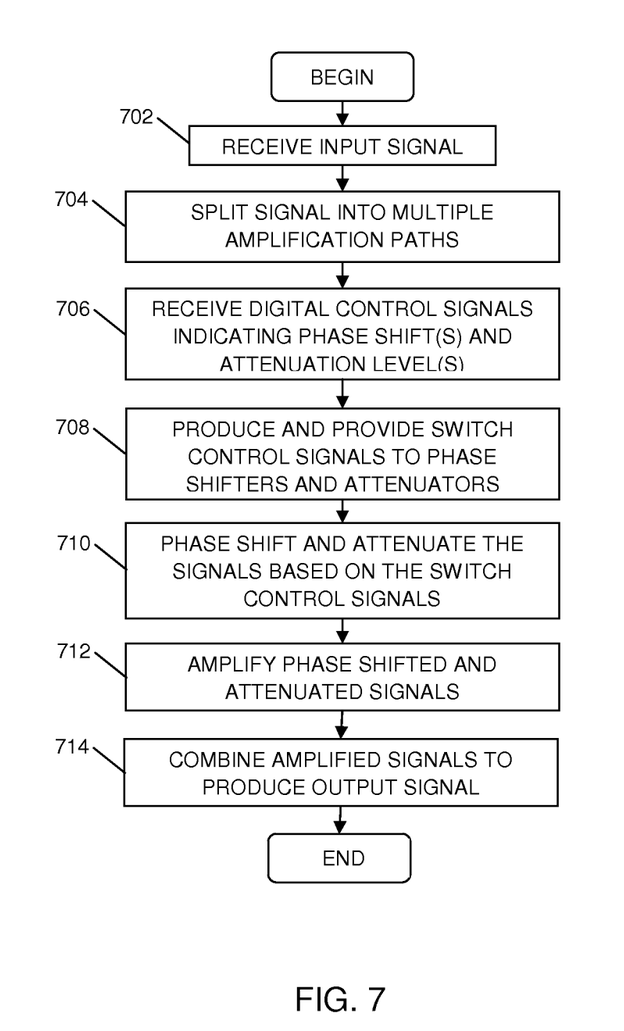
FIG. 7 is a flowchart of a method for operating a digitally-controlled, variable attenuator, in accordance with an example embodiment.

FIG. 7 is a flowchart of a method for operating a digitally-controlled, variable attenuator in the context of an amplifier system (e.g., system 600, FIG. 6), in accordance with an example embodiment. It is to be understood that the system and method of FIGS. 6 and 7 are provided for example purposes, and that embodiments of variable attenuators described herein may be used in any of a variety of different types of systems. Accordingly, the examples provided in conjunction with FIGS. 6 and 7 should not be construed to limit application of the various embodiments to the specifically described and illustrated system and method.

According to an embodiment, the example method begins, in block 702, by receiving an input signal (e.g., at input terminal 602). For example, the input signal may be an RF signal intended for transmission over an air interface, and the amplifier system may be configured to amplify the signal prior to providing the signal to an antenna. Alternatively, the input signal may be of a type other than an RF signal. In block 704, the power of the received signal may be split into multiple (e.g., two or more) signals (e.g., by power splitter 612), and a phase shift may be applied to one or more of the split signals so that the split signals are provided out-of-phase to multiple (e.g., two or more) amplification paths. For example, each amplification path may include a phase shifter (e.g., phase shifter 614, 616), a variable attenuator (e.g., variable attenuator 618, 620), and an amplifier stage (e.g., amplifier stage 640, 642). The phase shifter and the variable attenuator may occur in either order.

In block 706, which may occur at an earlier stage in the process, the system may receive digital control signals indicating one or more phase shifts and one or more attenuation levels to be applied to the signals carried along the multiple amplification paths. For example, as discussed previously, another portion of the system may provide the digital control signals to a switch control circuit (e.g., switch control circuits 300, 500, 622). The digital control signals may include encoded values that indicate phase shifts and attenuation levels, respectively.

In block 708, the switch control circuit produces phase shifter switch control signals and variable attenuator switch control signals based on the values conveyed in the digital control signals, and provides the appropriate switch control signals to the phase shifters and variable attenuators. Based on the switch control signals, in block 710, the phase shifters and variable attenuators phase shift and attenuate, respectively, the signals carried along their respective amplification paths. For example, the variable attenuators may be configured according to any of the above-described variable attenuator embodiments, and the switch control circuit may produce variable attenuator switch control signals that affect the attenuation level applied by the variable attenuators based on digital input signals, as previously described. The phase shifters and variable attenuators produce phase shifted and attenuated versions of the split input signals.

In block 712, the phase shifted and attenuated signals may be amplified (e.g., one signal may be amplified by a main amplifier stage 640, and another signal may be amplified by a peaking amplifier stage 642). The amplified signals may then be combined, in block 714, by an output circuit (e.g., output circuit 650), which also may apply a phase shift to one or more of the signals to ensure that the signals are summed in phase before being provided to an output terminal (e.g., output terminal 604).

Thus, various embodiments of digitally-controlled step attenuators and methods of their operation have been described. An embodiment of a variable attenuator includes a first variable resistance circuit, a second variable resistance circuit, and multiple additional resistors. The first variable resistance circuit is coupled between an input terminal and an output terminal of the variable attenuator, and the first variable resistance circuit includes first, second, and third current paths. The first current path includes two first resistors and a first switch. The two first resistors are coupled in series with each other between the input terminal and the output terminal, and the first switch has a first channel coupled across one of the two first resistors. The second current path includes a second switch having a second channel, a first current conducting terminal coupled to the input terminal, and a second current conducting terminal coupled to the output terminal. The third current path includes a second resistor having a first terminal coupled to the input terminal, and a second terminal coupled to the output terminal. The multiple additional resistors include a third resistor and a fourth resistor. The third resistor has a first terminal coupled to the input terminal, and a second terminal coupled to an intermediate node. The fourth resistor has a first terminal coupled to the output terminal, and a second terminal coupled to the intermediate node. The second variable resistance circuit is coupled between the intermediate node and a voltage reference terminal.

An embodiment of an electronic circuit includes a variable attenuator. The variable attenuator includes a first variable resistance circuit, a second variable resistance circuit, and multiple additional resistors. The first variable resistance circuit has a first plurality of current paths that are coupled in parallel with each other between a first input terminal and a first output terminal of the variable attenuator. A first current path of the first plurality of current paths includes two first resistors coupled in series with each other between the first input terminal and the first output terminal, and a first switch, which has a first channel coupled across one of the two first resistors. The multiple additional resistors include a second resistor and a third resistor. The second resistor has a first terminal coupled to the first input terminal, and a second terminal coupled to a first intermediate node. The third resistor has a first terminal coupled to the first output terminal, and a second terminal coupled to the first intermediate node. The second variable resistance circuit has a first terminal coupled to the first intermediate node, and a second terminal coupled to a voltage reference terminal.

According to a further embodiment, the electronic circuit also includes a switch control circuit for providing a first control signal to a control terminal of the first switch, which affects a conductivity of the first channel, an effective resistance of the first variable resistance circuit, and an attenuation level provided by the variable attenuator. According to another further embodiment, the electronic circuit also includes a phase shifter and an amplifier stage. The phase shifter is coupled in series with the variable attenuator, and the variable attenuator and the phase shifter are configured to attenuate and apply a phase shift, respectively, to an input signal in order to produce a phase shifted and attenuated signal. The amplifier stage is configured to amplify the phase shifted and attenuated signal.

An embodiment of a method of operating an electronic circuit includes receiving a digital control signal that indicates a desired attenuation level for an input signal to the electronic circuit, producing a first control signal based on the desired attenuation level indicated in the digital control signal, and providing the first control signal to a control terminal of a first switch of a variable attenuator. The variable attenuator includes a first variable resistance circuit, a second variable resistance circuit, and multiple additional resistors. The first variable resistance circuit has a first plurality of current paths that are coupled in parallel with each other between a first input terminal and a first output terminal of the variable attenuator. A first current path of the first plurality of current paths includes two first resistors coupled in series with each other between the first input terminal and the first output terminal, and a first switch, which has a first channel coupled across one of the two first resistors. The multiple additional resistors include a second resistor and a third resistor. The second resistor has a first terminal coupled to the first input terminal, and a second terminal coupled to a first intermediate node. The third resistor has a first terminal coupled to the first output terminal, and a second terminal coupled to the first intermediate node. The second variable resistance circuit has a first terminal coupled to the first intermediate node, and a second terminal coupled to a voltage reference terminal.

The terms "first," "second," "third," "fourth" and the like in the description and the claims are used for distinguishing between elements and not necessarily for describing a particular structural, sequential or chronological order. It is to be understood that the terms so used are interchangeable under appropriate circumstances. Furthermore, the terms "comprise," "include," "have" and any variations thereof, are intended to cover non-exclusive inclusions, such that a circuit, process, method, article, or apparatus that comprises a list of elements is not necessarily limited to those elements, but may include other elements not expressly listed or inherent to such circuit, process, method, article, or apparatus. The term "coupled," as used herein, is defined as directly or indirectly connected in an electrical or non-electrical manner.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A variable attenuator comprising:
    a first variable resistance circuit coupled between an input terminal and an output terminal of the variable attenuator, wherein the first variable resistance circuit includes
        a first current path that includes two first resistors and a first switch, wherein the two first resistors are coupled in series with each other between the input terminal and the output terminal, and the first switch has a first channel coupled across one of the two first resistors;
        a second current path that includes a second switch having a second channel, a first current conducting terminal coupled to the input terminal, and a second current conducting terminal coupled to the output terminal, and
        a third current path that includes a second resistor having a first terminal coupled to the input terminal, and a second terminal coupled to the output terminal;
    a third resistor having a first terminal coupled to the input terminal, and a second terminal coupled to an intermediate node;
    a fourth resistor having a first terminal coupled to the output terminal, and a second terminal coupled to the intermediate node; and
    a second variable resistance circuit coupled between the intermediate node and a voltage reference terminal.

2. The variable attenuator of claim 1, further comprising:
    a switch control circuit for providing a first control signal to a control terminal of the first switch, and for providing a second control signal to a control terminal of the second switch, wherein the first and second control signals affect conductivities of the first and second channels, an effective resistance of the first variable resistance circuit, and an attenuation level provided by the variable attenuator.

3. The variable attenuator of claim 2, wherein the variable attenuator is configured:
    to attenuate an input signal provided at the input terminal by a first attenuation level when the switch control circuit provides the first and second control signals to cause the first and second channels to be substantially conductive;
    to attenuate the input signal by a second attenuation level that is greater than the first attenuation level when the switch control circuit provides the first control signal to cause the first channel to be substantially conductive, and provides the second control signal to cause the second channel to be substantially non-conductive; and
    to attenuate the input signal by a third attenuation level that is greater than the second attenuation level when the switch control circuit provides the first and second control signals to cause the first and second channels to be substantially non-conductive.

4. The variable attenuator of claim 1, wherein the second variable resistance circuit comprises:
    a fourth current path coupled between the intermediate node and the voltage reference terminal, which includes a fifth resistor coupled in series with a third switch having a third channel, a first current conducting terminal coupled to the input terminal, and a second current conducting terminal coupled to the output terminal;
    a fifth current path coupled between the intermediate node and the voltage reference terminal, which includes a sixth resistor coupled in series with a fourth switch having a fourth channel, a first current conducting terminal coupled to the input terminal, and a second current conducting terminal coupled to the output terminal; and
    a sixth current path coupled between the intermediate node and the voltage reference terminal, which includes a seventh resistor coupled in series with a fifth switch having a fifth channel, a first current conducting terminal coupled to the input terminal, and a second current conducting terminal coupled to the output terminal.

5. The variable attenuator of claim 4, further comprising:
    a switch control circuit for providing a first control signal to a control terminal of the first switch, a second control signal to a control terminal of the second switch, a third control signal to a control terminal of the third switch, a fourth control signal to a control terminal of the fourth switch, and a fifth control signal to a control terminal of the fifth switch, in order to adjust conductivities of the first, second, third, fourth, and fifth channels, effective resistances of the first and second variable resistance circuits, and an attenuation level provided by the variable attenuator.

6. The variable attenuator of claim 5, wherein the variable attenuator is configured:
    to attenuate an input signal provided at the input terminal by a first attenuation level when the switch control circuit provides the first and second control signals to cause the first and second channels to be substantially conductive, and provides the third, fourth, and fifth control signals to cause the third, fourth, and fifth channels to be substantially non-conductive;
    to attenuate the input signal by a second attenuation level that is greater than the first attenuation level when the switch control circuit provides the first and third control signals to cause the first and third channels to be substantially conductive, and provides the second, fourth, and fifth control signals to cause the second, fourth, and fifth channels to be substantially non-conductive;

to attenuate the input signal by a third attenuation level that is greater than the second attenuation level when the switch control circuit provides the first, third, and fourth control signals to cause the first, third, and fourth channels to be substantially conductive, and provides the second and fifth control signals to cause the second and fifth channels to be substantially non-conductive; and to attenuate the input signal by a fourth attenuation level that is greater than the third attenuation level when the switch control circuit provides the first and second control signals to cause the first and second channels to be substantially non-conductive, and provides the third, fourth, and fifth control signals to cause the third, fourth, and fifth channels to be substantially conductive.

7. The variable attenuator of claim 6, wherein the switch control circuit further comprises:
a multiple-bit input for receiving a digital control signal, wherein the switch control circuit is configured to provide the first, second, third, fourth, and fifth control signals based on a value of the digital control signal.

8. An electronic circuit that includes a variable attenuator, the variable attenuator comprising:
a first variable resistance circuit having a first plurality of current paths that are coupled in parallel with each other between a first input terminal and a first output terminal of the variable attenuator, wherein a first current path of the first plurality of current paths includes:
two first resistors coupled in series with each other between the first input terminal and the first output terminal, and
a first switch, which has a first channel coupled across one of the two first resistors;
a second resistor having a first terminal coupled to the first input terminal, and a second terminal coupled to a first intermediate node;
a third resistor having a first terminal coupled to the first output terminal, and a second terminal coupled to the first intermediate node; and
a second variable resistance circuit having a first terminal coupled to the first intermediate node, and a second terminal coupled to a voltage reference terminal.

9. The electronic circuit of claim 8, wherein the first plurality of current paths further comprises:
a second current path that includes a second switch having a second channel, a first current conducting terminal coupled to the first input terminal, and a second current conducting terminal coupled to the first output terminal.

10. The electronic circuit of claim 9, wherein the first plurality of current paths further comprises:
a third current path that includes a third resistor having a first terminal coupled to the first input terminal, and a second terminal coupled to the first output terminal.

11. The electronic circuit of claim 8, wherein the second variable resistance circuit further comprises:
a second plurality of current paths that are coupled in parallel with each other between the first intermediate node and the voltage reference terminal.

12. The electronic circuit of claim 11, wherein each current path of the second plurality of current paths comprises:
a shunt resistor; and
a shunt switch having a channel coupled in series with the shunt resistor.

13. The electronic circuit of claim 8, further comprising:
a switch control circuit for providing a first control signal to a control terminal of the first switch, wherein the first control signal affects a conductivity of the first channel, an effective resistance of the first variable resistance circuit, and an attenuation level provided by the variable attenuator.

14. The electronic circuit of claim 8, wherein the first variable resistance circuit, the second resistor, the third resistor, and the second variable resistance circuit are included within a first stage of the variable attenuator, wherein the first stage is configured to provide a first number of attenuation levels, and wherein the variable attenuator further comprises:
a second stage of the variable attenuator coupled in series with the first stage of the variable attenuator, wherein the second stage is configured to provide a second number of attenuation levels, wherein the second stage of the variable attenuator includes
a third variable resistance circuit having a second plurality of current paths that are coupled in parallel with each other between a second input terminal and a second output terminal,
a fourth resistor having a first terminal coupled to the second input terminal, and a second terminal coupled to a second intermediate node,
a fifth resistor having a first terminal coupled to the second output terminal, and a second terminal coupled to the second intermediate node; and
a fourth variable resistance circuit having a first terminal coupled to the second intermediate node, and a second terminal coupled to the voltage reference terminal.

15. The electronic circuit of claim 8, further comprising:
a phase shifter coupled in series with the variable attenuator, wherein the variable attenuator and the phase shifter are configured to attenuate and apply a phase shift, respectively, to an input signal in order to produce a phase shifted and attenuated signal; and
an amplifier stage configured to amplify the phase shifted and attenuated signal.

16. A method of operating an electronic circuit, the method comprising the steps of:
receiving a digital control signal that indicates a desired attenuation level for an input signal to the electronic circuit;
producing a first control signal based on the desired attenuation level indicated in the digital control signal; and
providing the first control signal to a control terminal of a first switch of a variable attenuator that includes
a first variable resistance circuit having a first plurality of current paths that are coupled in parallel with each other between an input terminal and an output terminal of the variable attenuator, wherein a first current path of the first plurality of current paths includes:
two first resistors coupled in series with each other between the input terminal and the output terminal, and
the first switch, which has a first channel coupled across one of the two first resistors, wherein the first control signal affects a conductivity of the first channel, an effective resistance of the first variable resistance circuit, and an attenuation level provided by the variable attenuator,
a second resistor having a first terminal coupled to the input terminal, and a second terminal coupled to a first intermediate node,
a third resistor having a first terminal coupled to the output terminal, and a second terminal coupled to the first intermediate node, and
a second variable resistance circuit having a first terminal coupled to the first intermediate node, and a second terminal coupled to a voltage reference terminal.

17. The method of claim 16, wherein the first variable resistance circuit further includes a second current path that includes a second switch having a second channel, a first current conducting terminal coupled to the input terminal, and a second current conducting terminal coupled to the output terminal, and wherein the method further comprises:
- producing a second control signal based on the desired attenuation level indicated in the digital control signal; and
- providing the second control signal to a control terminal of the second switch, wherein the second control signal affects a conductivity of the second channel, the effective resistance of the first variable resistance circuit, and the attenuation level provided by the variable attenuator.

18. The method of claim 16, wherein the second variable resistance circuit includes a second plurality of current paths that are coupled in parallel with each other between the intermediate node and the voltage reference terminal, wherein each current path of the second plurality of current paths includes a shunt resistor and a shunt switch having a channel coupled in series with the shunt resistor, and wherein the method further comprises:
- producing a plurality of additional control signals based on the desired attenuation level indicated in the digital control signal; and
- providing the plurality of additional control signals to control terminals of the shunt switches, wherein the additional control signals affect conductivities of the channels of the shunt switches, the effective resistance of the second variable resistance circuit, and the attenuation level provided by the variable attenuator.

19. The method of claim 16, wherein the first variable resistance circuit, the second resistor, the third resistor, and the second variable resistance circuit are included within a first stage of the variable attenuator, wherein the first stage is configured to provide a first number of attenuation levels, wherein the variable attenuator also includes a second stage coupled in series with the first stage and configured to provide a second number of attenuation levels, and wherein the method further comprises:
- producing one or more additional control signals based on the desired attenuation level indicated in the digital control signal; and
- providing the one or more additional control signals to the second stage of the variable attenuator to affect the attenuation level provided by the variable attenuator.

* * * * *